United States Patent
Day et al.

(10) Patent No.: US 11,101,631 B2
(45) Date of Patent: Aug. 24, 2021

(54) DOWNED CONDUCTOR DETECTION

(71) Applicant: Eaton Intelligent Power Limited, Dublin (IE)

(72) Inventors: Timothy Robert Day, Auburn, CA (US); Madhab Paudel, Greenfield, WI (US)

(73) Assignee: Eaton Intelligent Power Limited, Dublin (IE)

( * ) Notice: Subject to any disclaimer, the term of this patent is extended or adjusted under 35 U.S.C. 154(b) by 160 days.

(21) Appl. No.: 16/452,695

(22) Filed: Jun. 26, 2019

(65) Prior Publication Data
US 2020/0044435 A1 Feb. 6, 2020

Related U.S. Application Data

(60) Provisional application No. 62/712,307, filed on Jul. 31, 2018.

(51) Int. Cl.
*H02H 3/26* (2006.01)
*H02H 1/00* (2006.01)
*H02J 3/00* (2006.01)

(52) U.S. Cl.
CPC ........ *H02H 1/0061* (2013.01); *H02H 1/0015* (2013.01); *H02H 3/26* (2013.01); *H02J 3/0012* (2020.01)

(58) Field of Classification Search
CPC ....... H02J 3/0012; H02H 1/0061; H02H 3/26; H02H 1/0015
See application file for complete search history.

(56) References Cited

U.S. PATENT DOCUMENTS

| 5,103,365 A | 4/1992 | Uchida et al. |
| 6,307,576 B1 | 10/2001 | Rosenfeld |
| 2003/0038640 A1* | 2/2003 | Zuercher .................. H02H 1/04 324/536 |

(Continued)

FOREIGN PATENT DOCUMENTS

| EP | 0267500 A1 | 5/1988 |
| WO | 9912048 A1 | 3/1999 |

OTHER PUBLICATIONS

Machine translation of EP267500A1 by ESPNET on Jan. 21, 2021, 8 pages (Year: 2021).*

(Continued)

*Primary Examiner* — Harry R Behm
(74) *Attorney, Agent, or Firm* — DiBerardino McGovern IP Group LLC

(57) ABSTRACT

Techniques for determining whether a downed conductor is present in an electrical power distribution network that includes a neutral line and a plurality of energized conductors are disclosed. For example, a sampled neutral current signal is received, the sampled current signal including a plurality of values, each of the values representing an amplitude of current that flows in of the neutral conductor at a particular time; an unfiltered current signal is generated based on the sampled current signal; the sampled current signal is filtered to generate a filtered current signal; the unfiltered current signal and the filtered current signal are compared to generate an error signal; and the error signal is analyzed to determine whether at least one of the plurality of conductors is a downed conductor.

20 Claims, 7 Drawing Sheets

(56) References Cited

U.S. PATENT DOCUMENTS

2004/0066593 A1      4/2004   Kolker et al.
2008/0031520 A1*     2/2008   Hou ..................... H02H 1/0015
                                                         382/168
2009/0161270 A1*     6/2009   Beatty, Jr. ................ H02H 9/00
                                                         361/42

OTHER PUBLICATIONS

Minh Nguyen, European International Searching Authority, International Search Report and Written Opinion, counterpart PCT Application No. PCT/EP2019/025249 dated Nov. 14, 2019, 11 pages total.

Arc Sense Technology (AST), High-Impedance Fault Detection, Schweitzer Engineering Laboratories, SEL, PF00160, www.selinc.com, 2016, 8 total pages.

* cited by examiner

DOWNED CONDUCTOR DETECTION

CROSS-REFERENCE TO RELATED APPLICATION

This application claims the benefit of U.S. Provisional Application No. 62/712,307, filed on Jul. 31, 2018 and titled DOWNED CONDUCTOR DETECTION, which is incorporated herein by reference in its entirety.

TECHNICAL FIELD

This disclosure relates to detection of a downed conductor in an electrical power distribution network.

BACKGROUND

An electrical power distribution network includes conductors that carry electrical current from one portion of the distribution network to another portion of the distribution network. The conductors may be, for example, copper or aluminum wires, metal cables protected by an insulator, or any other mechanism capable of carrying electrical current. The electrical conductors are mounted to various structures in the distribution network. For example, the electrical conductors may be mounted to utility poles, frames or other mounting structures in a substation, pylons, or support towers. The support structures are set on the earth or on a foundation that is set into the earth. Mounting the conductor on a structure allows the conductor to be operated safely and away from the public and/or objects that could interfere with the distribution of electricity. Additionally, the structures allow the electrical conductors to be mounted overhead (for example, at least 4.5 meters above the earth). Abnormal events may interfere with the conductors. For example, falling debris, flying objects, lighting strikes, movement of the mounting structures, and/or very high winds may sever a conductor and cause a portion of the conductor to reach the earth or other objects that the conductor is not intended to reach. These severed conductors are "downed conductors." A downed conductor may remain energized and may form an arc, thereby creating a hazardous situation.

SUMMARY

In one general aspect, a method of determining whether a downed conductor is present in an electrical power distribution network, which includes a neutral line and a plurality of conductors, includes receiving a sampled current signal, the sampled current signal including a plurality of values, each of the values representing an amplitude of current that flows in all of the plurality of conductors at a particular time and summed to produce a sampled neutral current signal; generating an unfiltered current signal based on the sampled current signal; filtering the sampled current signal to generate a filtered current signal; comparing the unfiltered current signal and the filtered current signal to generate an error signal; and analyzing the error signal to determine whether at least one of the plurality of conductors is a downed conductor.

Implementations may include one or more of the following features. The error signal may be filtered to generate a filtered error signal prior to analyzing the error signal. Filtering the error signal to generate filtered error signal may include filtering the error signal to generate a moving average of the error signal. Analyzing the error signal to determine whether at least one of the plurality of conductors is a downed conductor may include comparing the error signal to the generated moving average of the error signal. Filtering the error signal may include filtering the error signal with an infinite impulse response (IIR) filter. Comparing the unfiltered current signal and the filtered current signal may include determining a difference between the unfiltered current signal and the filtered current signal. Determining the difference between the unfiltered current signal and the filtered current signal may include determining a difference between each sample of the unfiltered signal and a corresponding sample of the filtered signal.

In some implementations, when a downed conductor is determined to exist, a perceivable warning signal is generated and/or the downed conductor is disconnected from the network.

In another general aspect, a system includes an electrical apparatus configured to measure current that flows in more than one conductor in an electrical power distribution network that includes a neutral line; and a control system coupled to the electrical apparatus. The control system is configured to: receive sampled current from the electrical apparatus; generate an unfiltered current signal based on the received sampled current; filter the received sampled current to generate a filtered current signal; compare the unfiltered current signal and the filtered current signal to generate an error signal; and analyze the error signal to determine whether at least one of the plurality of conductors is a downed conductor.

Implementations may include one or more of the following features. The electrical apparatus may be a recloser. The electrical apparatus may be a circuit breaker.

In another general aspect, a control system configured to couple to an electrical apparatus that measures current flowing in more than one conductor of an electrical power distribution network includes a downed conductor detection module configured to: receive sampled current from the electrical apparatus; generate an unfiltered current signal based on the received sampled current; filter the received sampled current to generate a filtered current signal; compare the unfiltered current signal and the filtered current signal to generate an error signal; and analyze the error signal to determine whether at least one of a plurality of conductors is a downed conductor.

Implementations of any of the techniques described herein may include an electrical apparatus, a control system, a system that includes an electrical apparatus and control system, a downed conductor detection module, software stored on a non-transitory computer readable medium that, when executed, monitors and/or analyzes electrical current that flows in the distribution network and determines whether a downed conductor is present, a method, and/or a software upgrade for retrofitting a recloser or protective relay. The details of one or more implementations are set forth in the accompanying drawings and the description below. Other features will be apparent from the description and drawings, and from the claims.

DRAWING DESCRIPTION

DETAILED DESCRIPTION

Techniques for detecting the presence of a downed or broken conductor in an electrical power distribution network that includes a neutral are disclosed.

Figure 1:
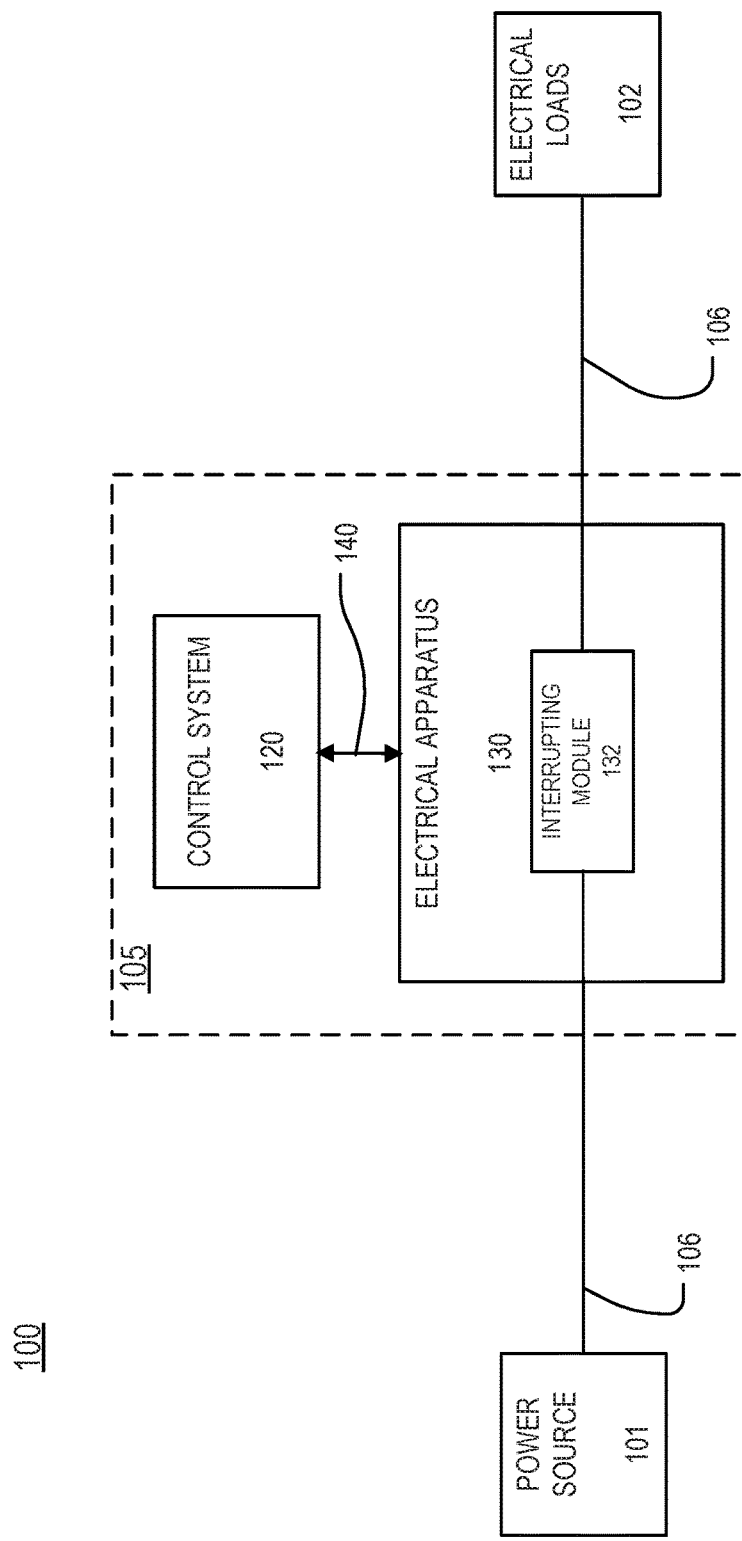
FIG. 1 is a block diagram of an example of an electrical power distribution network.

Referring to FIG. 1, a block diagram of an example electrical power distribution network 100 is shown. The power distribution network 100 distributes electricity from an electrical power source 101 to electrical loads 102 via a distribution path 106. The electrical power distribution network 100 is a multi-phase electrical network that provides electricity to commercial and/or residential customers. The power distribution network 100 may have an operating voltage of, for example, at least 1 kilovolt (kV), up to 38 kV, or higher. The power distribution network 100 may operate at a fundamental frequency of, for example, 50-60 Hertz (Hz).

The flow of electricity between the source 101 and the loads 102 is controlled by a system 105, which includes an electrical apparatus 130 and a control system 120 that communicates with the electrical apparatus 130 through a data connection 140. The electrical apparatus 130 is any device capable of controlling and/or monitoring electricity on the distribution path 106. For example, the electrical apparatus 130 may be a recloser or a circuit breaker. The control system 120 may be a recloser control or a protective relay. As discussed in greater detail below, the control system 120 is configured to detect the presence of a downed or broken conductor in the distribution path 106.

The power source 101 is any source that is capable of providing alternating current (AC) electrical current in more than one phase. For example, the power source 101 may be an electrical generator that converts mechanical power into three AC electrical currents, one from each coil or winding of the generator, with the coils being arranged such that each of the three generated AC electrical currents are sinusoidal and have the same amplitude and frequency, but different phases. For example, the three AC electrical currents may be 120 degrees (°) out of phase with each other. The electrical loads 102 may be any electrical equipment that receives electricity from the power source 101 and may include, for example, transformers, fuses, electrical machinery in a manufacturing facility, and/or electrical appliances and devices in a residential building.

Figure 2:
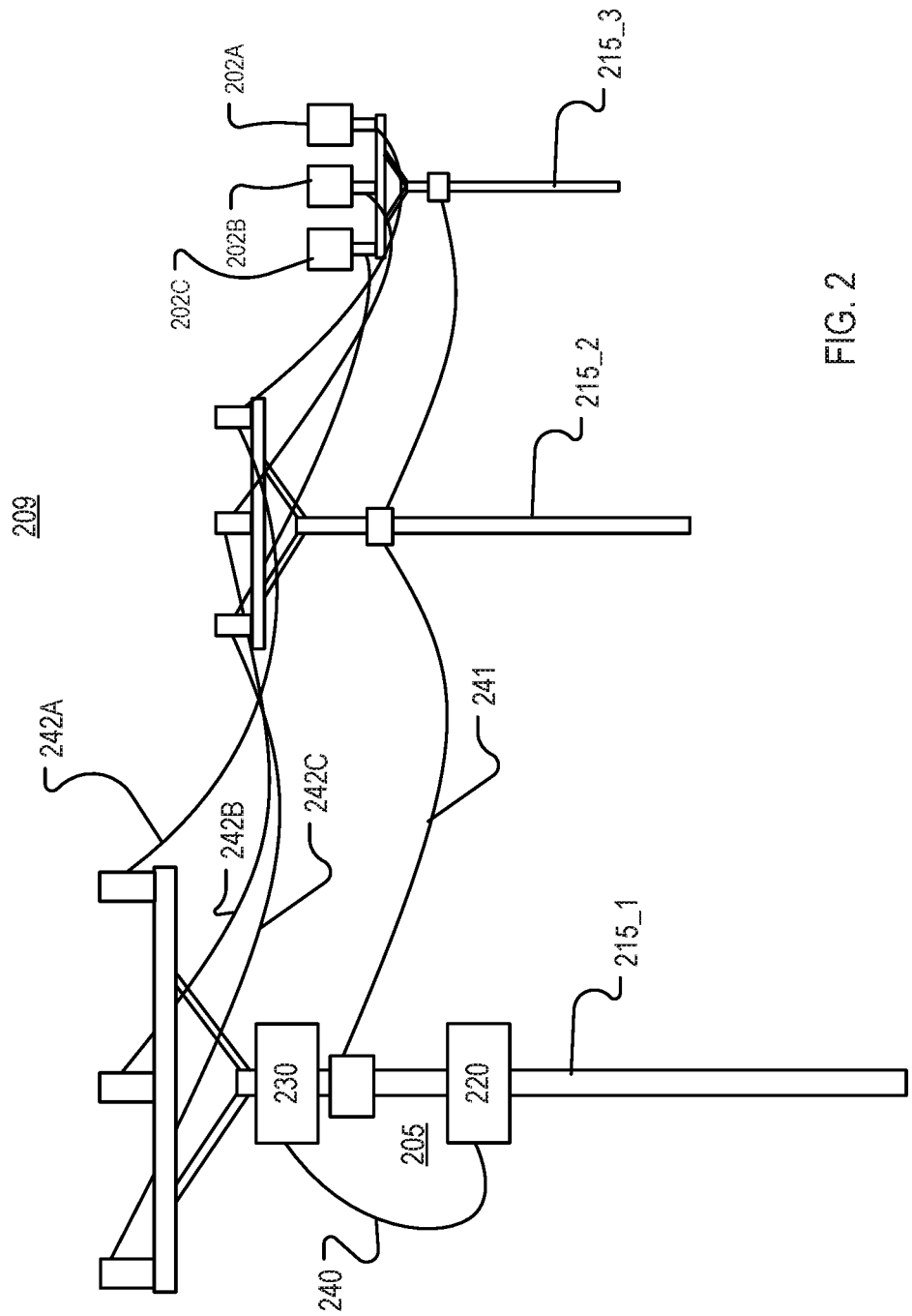
FIG. 2 is an illustration of an example of a three-phase circuit that includes a neutral.

Referring also to FIG. 2, the distribution path 106 includes one or more four-wire, multi-grounded overhead distribution circuits, such as the circuit 209 illustrated in FIG. 2. The circuit 209 includes three electrical conductors 242A, 242B, 242C and a neutral 241 mounted on structures 215_1, 215_2, 215_3. The circuit 209 is a three-phase circuit, and each electrical conductor 242A, 242B, 242C carries electrical current in one of the three phases. For example, each electrical conductor 242A, 242B, 242C may receive one of the three phases of AC current generated by the power source 101 (FIG. 1).

The electrical conductors 242A, 242B, 242C deliver electrical current to loads 202A, 202B, 202C, respectively. Each load 202A, 202B, 202C is connected to the neutral 241. In other words, each load 202A, 202B, 202C is connected between one of the three phases and the neutral 241. The neutral 241 carries a current called the neutral current, which is the sum of the currents that flow in the electrical conductors 242A, 242B, 242C. The current that flows in the three electrical conductors 242A, 242B, 242C is monitored by an electrical system 205 that includes an electrical apparatus 230 and a control system 220, which communicates with the electrical apparatus 230 via a data connection 240. The electrical system 205 is similar to the system 105 (FIG. 1). In the example of FIG. 2, the electrical system 205 is mounted on the structure 215_1, which is a utility pole. Other configurations are possible. For example, the electrical system 205 may be part of a substation that is between the source 101 and the loads 202A, 202B, 202C. In these implementations, the electrical system 205 may be attached to a substation mounting frame.

The circuit 209 may become damaged during use. For example, one or more of the conductors 242A, 242B, 242C may be severed by a falling tree limb or other object. Such a severed or broken conductor is a "downed conductor." A downed conductor may create a hazard. For example, after being severed, the conductor may be within reach of members of the public and/or generate an electrical arc that could start a fire in a nearby object. Thus, it is desirable to detect the presence of a downed conductor such that measures to prevent or mitigate harm may be initiated.

The control system 220 determines whether any of the electrical conductors 242A, 242B, 242C have become downed conductors. Current that flows into an arcing fault caused by a downed conductor has an incoherent, random, and/or pseudo-random nature that differs from ordinary current drawn by the loads 202A, 202B, 202C. The control system 220 uses characteristics of the current that flows in the circuit 209 to determine whether a downed conductor is present.

When the loads 202A, 202B, 202C have the same impedance, each load 202A, 202B, 202C draws the same amount of current. In this scenario, the sum of the currents in the conductors 242A, 242B, 242C is zero, and the neutral current is zero. However, in ordinary use under steady-state conditions, the loads 202A, 202B, 202C generally do not have the same impedance and, thus, each load 202A, 202B, 202C draws a different amount of current. As such, the sum of the currents in the conductors 242A, 242B, 242C is not zero and the neutral current is not zero, even in the steady state. The condition of the neutral current being non-zero in steady-state makes detection of downed conductors in a four-wire, multi-grounded system challenging. For example, some prior systems relied on an analysis of increases in the amplitude of the neutral current to detect the presence of a downed conductor. However, because the current drawn by the loads 202A, 202B, 202C varies during use and even under non-fault conditions, the amplitude of the neutral current in the circuit 209 may increase for reasons other than the presence of a downed conductor. The approach implemented by the control system 220 considers features of the neutral current other than or additional to the amplitude and is thus more robust and less prone to falsely declaring that a downed conductor is present in a four-wire system (such as shown in FIG. 2) than the prior approaches.

Additionally, the loads 202A, 202B, 202C may be non-linear loads, such as switching power supplies, in which the impedance of the load varies with the applied voltage. The current drawn by a non-linear load is not sinusoidal, even when the non-linear load receives a sinusoidal current from the power source 101. As a result, frequencies other than the fundamental frequency may be introduced into current that flows in the circuit 209. The approach implemented by the control system 220 includes analyzing an error signal formed by comparing a filtered signal, which is generated by removing or mitigating components of the neutral current that are at frequencies other than the fundamental frequency, to an unfiltered signal. This is unlike some prior approaches that analyzed the filtered signal and/or the unfiltered signal individually. Analyzing the error signal instead of the unfiltered signal and/or the filtered signal individually emphasizes the aspects of the current that are potentially caused by a downed conductor and thus allows for more robust and accurate analysis.

Referring again to FIG. 1, the electrical apparatus 130 includes an interrupting module 132 that is capable of interrupting (opening) and closing the distribution path 106. The control system 120 controls the operation of the interrupting module 132 through the data connection 140, and thus the control system 120 is also able to control the flow of electricity from the source 101 to the loads 102. When the distribution path 106 is open, current does not flow from the source 101 to the loads 102. When the distribution path 106 is closed, current flows from the source 101 to the loads 102. Under normal operating conditions, the interrupting module 132 is closed. When a fault condition (such as a downed conductor) occurs, the control system 120 commands the interrupting module 132 to open the distribution path 106 such that electrical current does not flow through the electrical apparatus 130.

Figure 3:
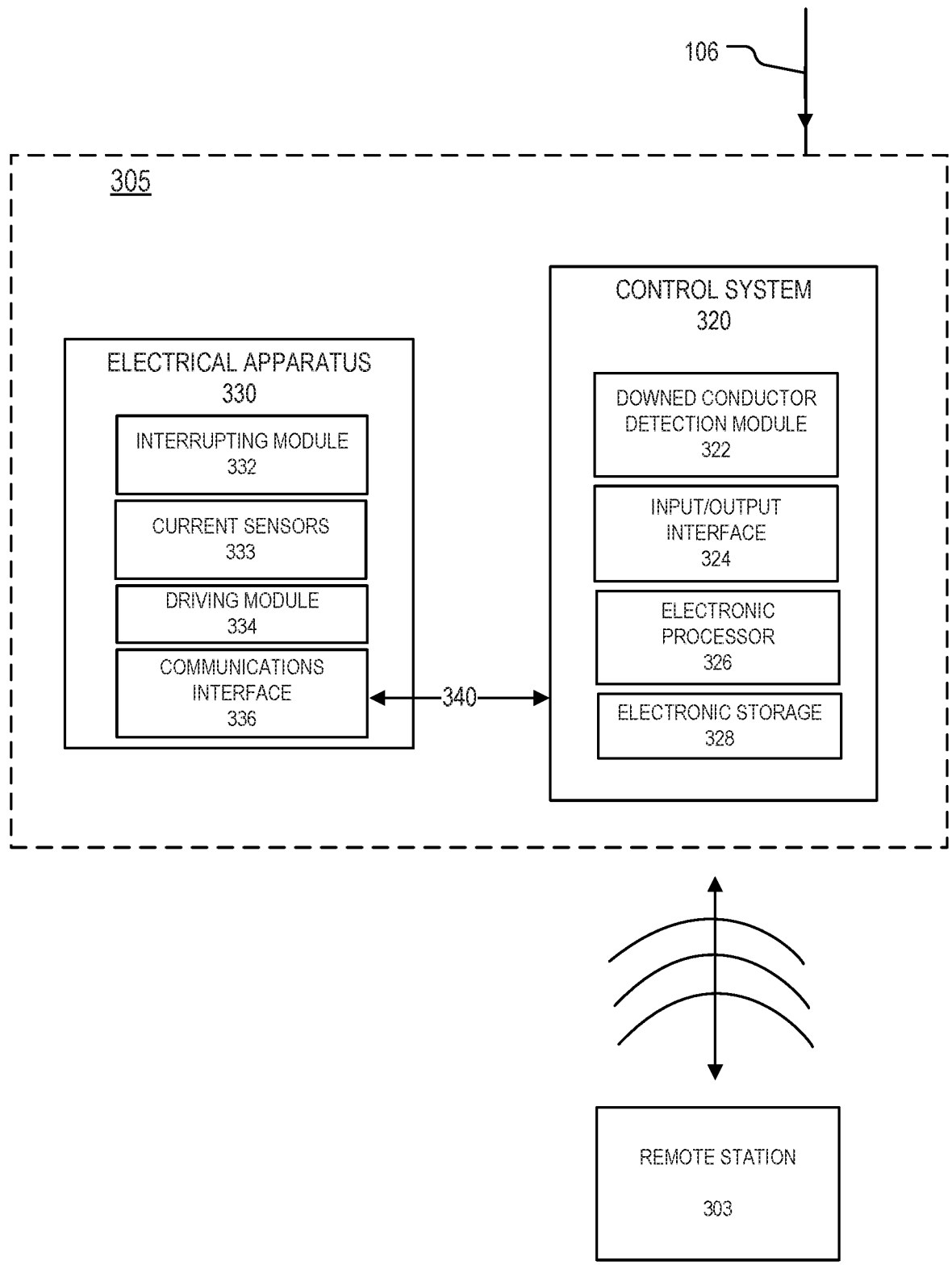
FIG. 3 is a block diagram of an example of an electrical system.

Referring to FIG. 3, a block diagram of an example system 305 is shown. The system 305 is used to control the flow of electricity between portions of an electrical power distribution network. For example, the system 305 may be used in the power distribution network 100 (FIG. 1) as the system 105 or in the circuit 209 as the system 205 (FIG. 2).

The system 305 includes a control system 320, which sends data to and receives data from an electrical apparatus 330 via a data connection 340. The electrical apparatus 330 includes an interrupting module 332, current sensors 333 (one current sensor per phase), a driving module 334, and a communications interface 336. The electrical apparatus 330 may be any type of apparatus that is capable of being controlled to open and close a distribution path in a power distribution network. For example, the electrical apparatus 330 may be a medium voltage circuit breaker, a triple single-phase recloser, or a three-phase recloser.

The data connection 340 may be any communication link capable of transmitting information. The data connection 340 sends information to and receives information from the control system 320. In typical implementations, the data connection 340 is a single control cable connected between the communications interface 336 of the electrical apparatus and the control system 320. The communications interface 336 may be any interface capable of sending data to and receiving data from an input/output interface 324 of the control system 320 via the connection 340.

The electrical apparatus 330 also includes the interrupting module 332 and the driving module 334, which drives the interrupting module 332 in response to a control signal received from the control system 320 via the data connection 340. The electrical apparatus 330 includes an interrupting module 332 for each phase. Thus, a three-phase apparatus includes three interrupting modules 332. The interrupting module 332 is any mechanism or device that is capable of interrupting (opening) the distribution path 106.

The electrical apparatus 330 also includes the current sensors 333 (such as current transformers) that sense the amount of current flowing in each phase in the distribution path 106. The current sensed by the current sensors 333 is provided to the control system 320 via the data connection 340. The driving module 334 may include passive and/or active electrical and/or mechanical components that drive the interrupting module 332 to open or close in response to a control signal from the control system 320. For example, in some implementations, the driving module 334 may include capacitors that provide energy to the interrupting module 332 for closing or opening the contacts. In some implementations, the driving module 334 includes magnets. The driving module 334 may include resistors, inductors, and other passive electronic components. In some implementations, the driving module 334 includes devices that store mechanical energy, such as springs. In some implementations, the driving module 334 includes a motor.

The system 305 also includes the control system 320. The control system 320 and the electrical apparatus 330 may be physically separated from each other. For example, the electrical apparatus 330 may be mounted near the top of a utility pole or other structure associated with overhead power lines, and the control system 320 may be mounted on the same pole or structure near the ground to facilitate operator access to the control system 320. In another example, the control system 320 may be located at a utility substation control house that is remote from the electrical apparatus 330, In yet other implementations, the control system 320 is integrated with the electrical apparatus 330 such that the system 305 forms a single, self-contained device. In implementations in which the control system 320 is integrated with the electrical apparatus 330, the control system 320 and the electrical apparatus 330 communicate data via the data connection 340, but the control system 320 and the electrical apparatus 330 are part of the same device and may be received in, for example, a single integrated housing.

Figure 4:
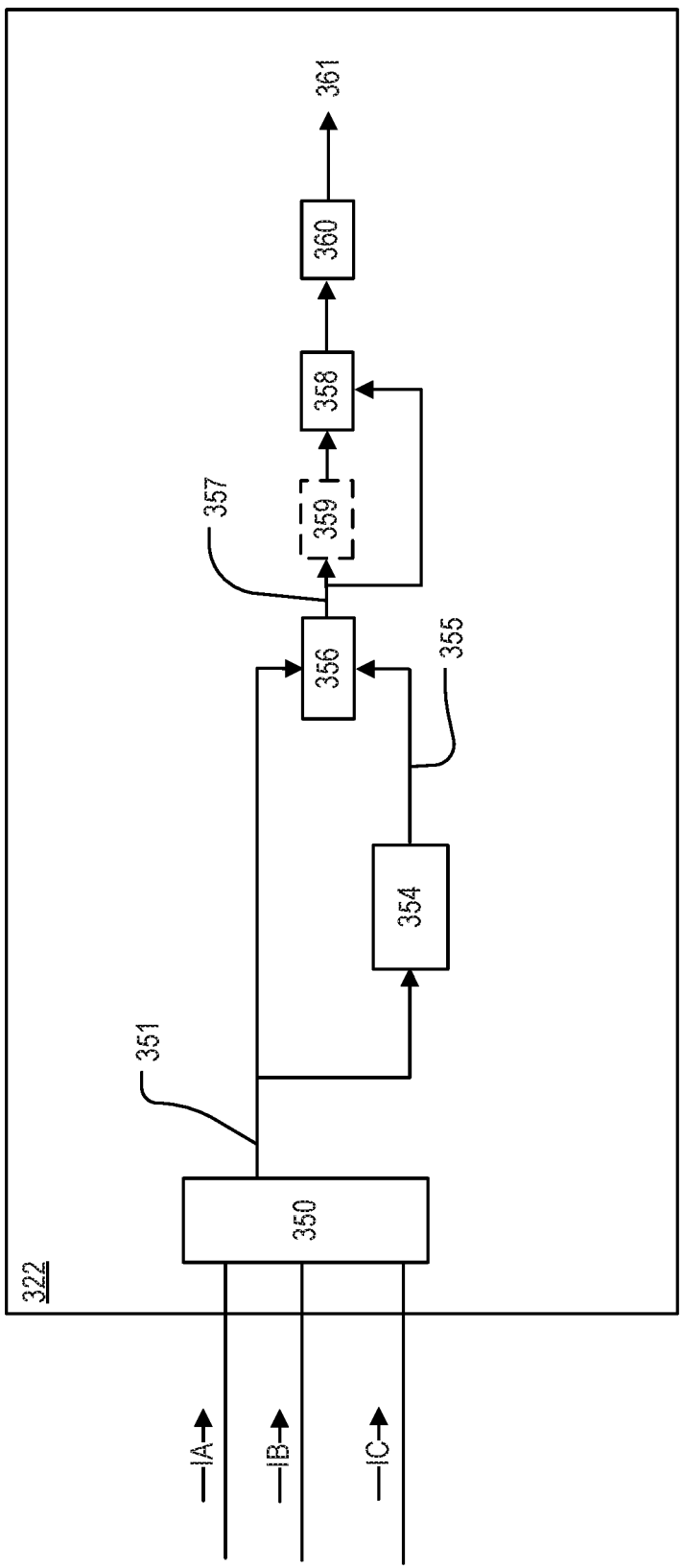
FIG. 4 is a block diagram of an example of a downed conductor detection module.
Figure 5:
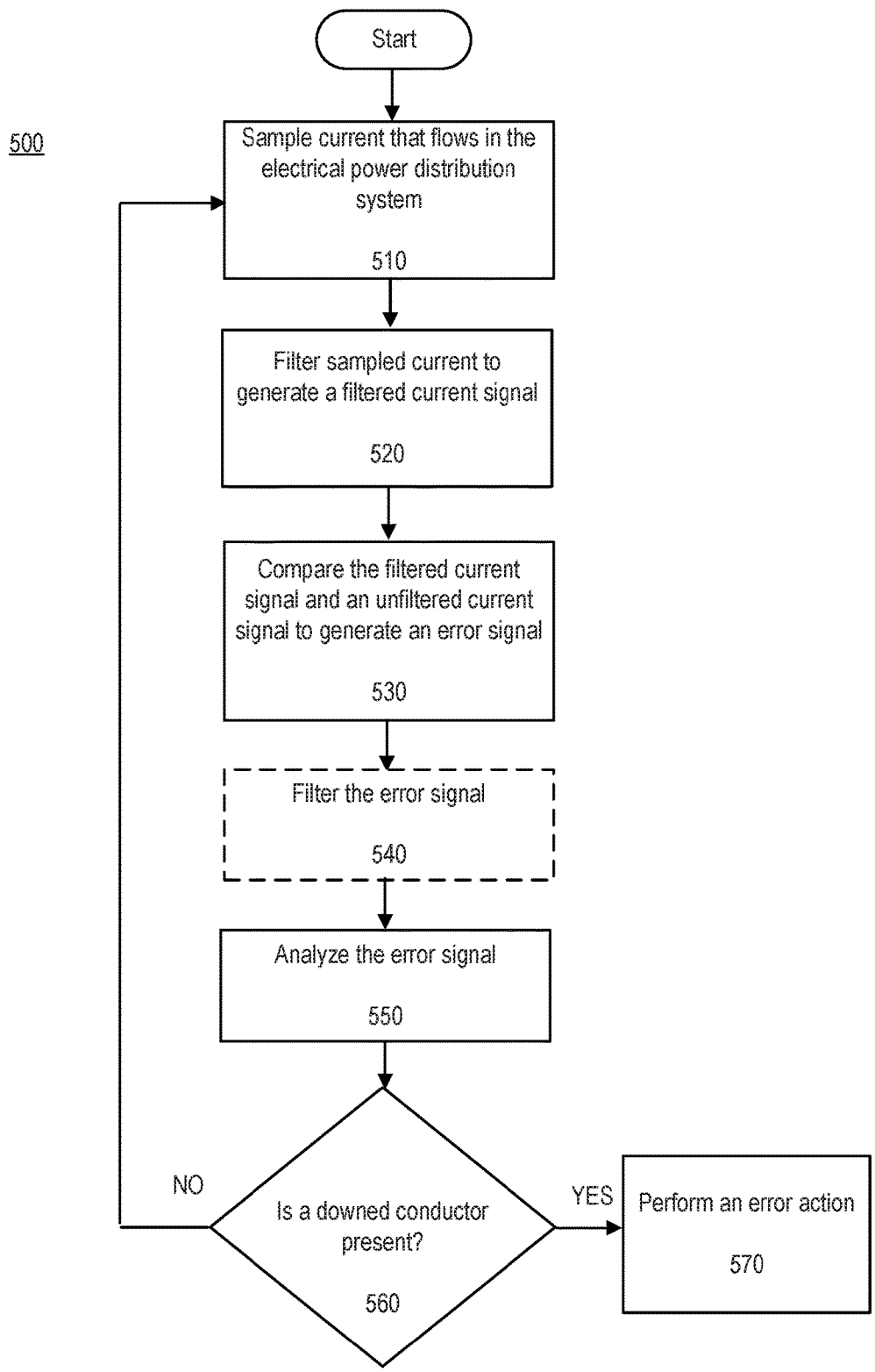
FIG. 5 is a flow chart of an example process for detecting a downed conductor.

The control system 320 includes a downed conductor detection module 322, an input/output (I/O) interface 324, an electronic processor 326, and an electronic storage 328. The downed conductor detection module 322 analyzes current sensed by the current sensors 333 to determine whether a conductor in the distribution path 106 is severed or broken. When a downed conductor is detected, the control system 320 may issue a command or control signal to the electrical apparatus 330 to open the interrupting module 332 to isolate the portion of the distribution path 106 that includes the downed conductor. In some implementations, the control system 320 causes a perceivable warning to be presented at the I/O interface 324. FIGS. 4 and 5 discuss the downed conductor detection module 322 in greater detail.

The I/O interface 324 may be any interface that allows a human operator and/or an autonomous process to interact with the control system 320. The I/O interface 324 may include, for example, a display, a keyboard, speakers, a serial or parallel port, a Universal Serial Bus (USB) connection, and/or any type of network interface, such as, for example, Ethernet. The I/O interface 324 also may allow communication without physical contact through, for example, a wireless communications protocol.

The I/O interface 324 also may allow the control system 320 to communicate with systems external to and remote from the system 305. For example, the I/O interface 324 may include a communications interface that allows communication between the control system 320 and a remote station 303, or between the control system 320 and an electrical apparatus other than the apparatus 330, through the I/O interface 324 using, for example, a Supervisory Control and Data Acquisition (SCADA) protocol.

The control system 320 also includes the electronic processor 326 and the electronic storage 328. The electronic processor 326 is one or more processors suitable for the execution of a computer program such as a general or special purpose microprocessor, and any one or more processors of any kind of digital computer. Generally, a processor receives instructions and data from a read-only memory or a random access memory or both. The electronic processor 326 may be any type of electronic processor, may be more than one electronic processor, and may include a general purpose central processing unit (CPU), a graphics processing unit (GPU), a microcontroller, a field-programmable gate array (FPGA), and/or an application-specific integrated circuit (ASIC). The electronic storage 328 may be volatile memory, such as RAM. In some implementations, the electronic storage 328 may include both non-volatile and volatile portions or components. Examples of electronic storage may include solid state storage, magnetic storage, and optical storage. Solid state storage may be implemented in, for example, resistor-transistor logic (RTL), complementary metal-oxide semiconductor (CMOS), or carbon nanotubes, and may be embodied in non-volatile or volatile random-access memory.

The electronic storage 328 stores instructions, perhaps as a computer program, that, when executed, cause the electronic processor 326 to perform a process to detect the presence of a downed conductor and to interact with components in the control system 320 (such as the downed conductor detection module 322 and the I/O interface 324), the electrical apparatus 330, and/or the remote station 303.

As discussed above, the electrical apparatus 330 may be, for example, a recloser or a circuit breaker. In implementations in which the electrical apparatus 330 is a recloser 330, the control system 320 is a recloser control 320. In these implementations, the recloser control 320 causes the recloser 330 to open the distribution path 106 when the downed conductor detection module 322 detects the presence of a downed conductor. The recloser control 320 also controls the recloser 330 to open or close the distribution path 106 based on other conditions on the distribution path 106.

In implementations in which the electrical apparatus 330 is a circuit breaker, the control system 320 is a protective relay 320. When the downed conductor detection module detects the presence of a downed conductor, the protective relay 320 generates a signal that causes the circuit breaker 330 to open the distribution path 106 to isolate the downed conductor. The protective relay 320 may be located in a substation and may be used to protect any type of electrical equipment.

FIG. 4 is a block diagram of an example implementation of the downed conductor detection module 322. The downed conductor detection module 322 includes a current signal generator 350 that receives an indication of the amount of instantaneous current that flows in the distribution path 106 at particular time. As discussed above, the electrical apparatus 330 includes the current sensors 333. The current sensors 333 sense the current that flows in each phase of the distribution path 106. The sensed current is provided to the downed conductor detection module 322 in the control system 320 via the data connection 340. The data from the current sensors 333 may be an analog measurement of the current in each phase, and the data from the current sensors 333 may be input into an analog-to-digital converter (ADC) to form a sampled current waveform.

In the example shown in FIG. 4, the current sensors 333 (FIGS. 3 and 3B) provide instantaneous currents (IA, IB, IC) on each of three phases (A, B, C) to the current signal generator 350. The current signal generator 350 determines the neutral current based on the values that represent the measured current in each phase. The neutral current at a particular time is the sum of the measured current in all of the phases at that particular time. The neutral current is digitized at a sufficient rate to form a sampled current signal 351. In this example, the sampled current signal 351 is a signal whose numerical value equals the neutral current at a particular instance in time.

The sampled current signal 351 (without modification) is the unfiltered neutral current signal 351. A signal that is identical to the sampled current signal 351 is passed to a digital filter 354. The digital filter 354 is configured to remove or mitigate frequency components in the sampled current signal 351 that are not at the fundamental frequency at which the distribution network 100 operates. In some implementations, the digital filter 354 is a 64-point, 1.25 cycle cosine filter. The digital filter 354 may remove signals with frequencies above the fundamental frequency, or the digital filter 354 may remove signals with frequencies above and below the fundamental frequency while allowing signals with the fundamental frequency to pass. For example, the digital filter 354 may be implemented as a discrete Fourier transform at the fundamental frequency. Regardless of the implementation of the digital filter 354, the filtered current signal 355 is a time-domain signal that does not include frequency components other than those at the fundamental frequency of the power distribution network 100, or includes only a negligible amount of components at frequencies other than the fundamental frequency.

Filtering the signal 351 with the digital filter 354 forms a filtered current signal 355. The filtered current signal 355 is a signal whose numerical value equals the filtered neutral current 355 at a particular time. The filtered current signal 355 and the unfiltered neutral current signal 351 have the same number of samples.

The downed conductor detection module 322 also includes a comparison module 356 that is configured to compare the filtered current signal 355 and the unfiltered neutral current signal 351. The comparison module 356 may perform a point-by-point comparison of the signals 355 and 351. The signal 351 and the signal 355 have the same number of samples, and each sample in the signal 351 has a corresponding sample in the signal 355. The point-by-point comparison may be performed by subtracting the value of each sample in the signal 355 from the value of the corresponding sample in the signal 351, or vice versa. The comparison module 356 performs the comparison between the signals 351 and 355 and produces an error signal 357 based on the comparison. For example, implementations in which the comparison module 356 performs a point-by-point comparison based on subtraction, the error signal 357 is a signal that includes the same number of sample values as the signals 351 and 355, and each sample value of the error signal 357 represents a difference between the value of the signal 351 and the value of the signal 357 at a particular time.

The downed conductor detection module 322 also includes an instance detection module 360 that analyzes the error signal 357 to determine whether a downed conductor is present. In some implementations, the downed conductor detection module 322 includes a filter 359 that filters the error signal 357. The filter 359 may be, for example, a first-order infinite impulse response (IIR) filter. In implementations that include the filter 359, the output of the filter 359 trends toward the slowly varying signal contained within the error signal 357. This output is used in a comparator 358, which compares the instantaneous error signal 357 to its slow time-varying component (the output of the filter 359), which serves as a dynamic threshold. The comparator 358 outputs an indication of whether or not the error signal 357 exceeded the dynamic threshold. An instance is declared by the instance detection module 360 if the error signal 357 is greater than the output of the filter 359. The output of the comparator 358 is analyzed by the instance detection module 360. The instance detection module 360 compares the rate of instance occurrence with the rate expected for a downed conductor. Only instances occurring at a sufficient rate are declared as caused by a downed conductor. In some implementations, the filter 359 is a low pass filter (LPF)-IIR dual filter that filters the maximum difference in the error signal 357 to detect the presence of a downed conductor.

FIG. 5 is a flow chart of a process 500 that may be used to detect the presence of a downed conductor using the downed conductor detection module 322. Neutral current that flows in the electrical power distribution network is sampled (510) and the sampled current signal 351 is generated, as discussed above. The sampled current signal 351 represents the neutral current. The sampled current signal 351 is filtered to generate the filtered current signal 355 (520).

The filtered current signal 355 is compared to the unfiltered neutral current signal 351 to generate the error signal 357 (530). As discussed above, the comparison may be a point-by-point difference. The error signal may be filtered by the filter 359 to form a dynamic threshold for use by the instance detection module 360 (540). A dynamic threshold is a threshold that has a value that changes over time. The output of the filter 359 is a dynamic average of the error signal 357. The output of the filter 359 is passed to the comparator 358. The comparator 358 compares the output of the filter 359 to the error signal 357. Because the output of the filter 359 is essentially a dynamic average of the error signal 357, comparing the output of the filter 359 to the error signal 357 may be considered to be similar to applying a dynamic threshold to the error signal 357.

The error signal 357 is analyzed to at the instance detection module 360 to determine whether a downed conductor is present (550). In implementations that include the filter 359, the error signal 357 is filtered by the filter 359 and the output of the filter 359 is analyzed at the comparator 358. The output of the comparator 358 indicates whether or not error signal 357 is greater than the dynamic threshold determined by the filter 359. In these implementations, the output of the comparator 358 is provided to the instance detection module 360. The instance detection module 360 determines the rate of occurrence, that is the number of times that the error signal 357 exceeds the dynamic threshold over a period of time is analyzed at the instance detection module 360

In implementations that do not include the filter 359, the unfiltered or unmodified error signal 357 is provided to the comparator 358. The comparator 358 compares the error signal 357 to a fixed threshold (instead of the output of the filter 359), and the output of the comparator 358 indicates whether the error signal 357 exceeds the threshold. The output of the comparator 358 is analyzed at the instance detection module 360.

Thus, the process 500 analyzes the error signal 357 instead of analyzing the unfiltered neutral current signal 351 or the filtered current signal 355 individually. Using the error signal 357 instead of the unfiltered neutral current signal 351 or the filtered current signal 355 individually may improve performance. For example, the presence of a downed conductor produces an incoherent, chaotic, and/or random variation in the neutral current. Although other events in the distribution network 100 also may introduce variations in the neutral current, the variations caused by events other than a downed conductor tend to be more regular and less chaotic than those caused by a downed conductor. In the time domain, the variations caused by a downed conductor or another event appear as deviations from the expected sinusoidal waveform. The variations may be relatively small compared to the expected current waveform, and the variations are not present in the filtered current signal 355. Thus, by determining the point-by-point difference between the filtered current signal 355 and the unfiltered neutral current signal 351, the variations become more pronounced and an analysis of the error signal 357 is thus more reliable than an analysis of the filtered current signal 355 or the unfiltered current signal 351 alone.

Accordingly, the process 500 provides an improvement over techniques that do not include such a comparison. Moreover, the process 500, which includes a comparison technique, is more accurate and is therefore more likely to only detect the presence of a downed conductor when a downed conductor exists. Thus, the process 500 may reduce downtime of the distribution network 100 and reduce service interruptions to customers, while also being able to detect actual downed conductors to ensure safety of the public and property. Furthermore, the comparison technique included in the process 500 is computationally efficient and straightforward to implement, thereby providing an improvement to the performance of the control system 320 as compared to a system that implements a more complex technique to address the challenges of detecting a downed conductor in a four-wire multi-grounded distribution network.

The instance detection module 360 is the final stage for determining whether a downed conductor is present (560). The instance detection module 360 uses the output of the comparator 358 to determine whether a downed conductor is present. In some implementations, the instance detection module 360 determines that a downed conductor is present when a characteristic incoherence occurs at an occurrence rate known to be associated with arcing from a downed conductor. For example, the instance detection module 360 may analyze the time between each of the detected instances or verify that a sufficient number of occurrences within a time period allow for a downed conductor to be declared. In yet another example, the instance detection module 360 may determine that a downed conductor is present when a certain number of samples of the magnitude of the output of the comparator 358 exceed a threshold value.

If a downed conductor is declared, the downed conductor detection module 322 performs an error action (560). The error action may be, for example, the generation of a control signal 361 (FIG. 4). The control signal 361 is a signal that is sufficient to cause the control system 320 to generate a perceivable alarm and/or cause the electrical apparatus 330 to open the distribution path 106 in a manner that de-energizes the downed conductor. In implementations in which the control signal 361 is used to control the electrical apparatus 330, the control signal 361 is provided to the electrical apparatus 330 via the data connection 340, and the control signal 361 includes information sufficient to cause the interrupting module 332 to operate and open the distribution path 106. For example, in implementations in which the control system 320 is implemented as a protective relay, the electrical apparatus 330 is a circuit breaker, and the control signal 361 is a signal that is sufficient to cause the circuit breaker to open the distribution path 106.

In implementations in which the control signal 361 is used to present a perceivable alarm, the control signal 361 is provided to the I/O interface 324 and/or to the remote station 303. In either case, the control signal 361 is sufficient to present a perceivable warning regarding the downed conductor. For example, the perceivable warning may be a visual warning presented on a display used by an operator and/or an audible warning. Moreover, the warning may be in the form of an email, text message, and/or voicemail that is provided to an operator or other responsible personnel.

If a downed conductor is not declared, the process 500 returns to (510) for continue monitoring or the process 500 may end based on an operator command.

Figure 6A:
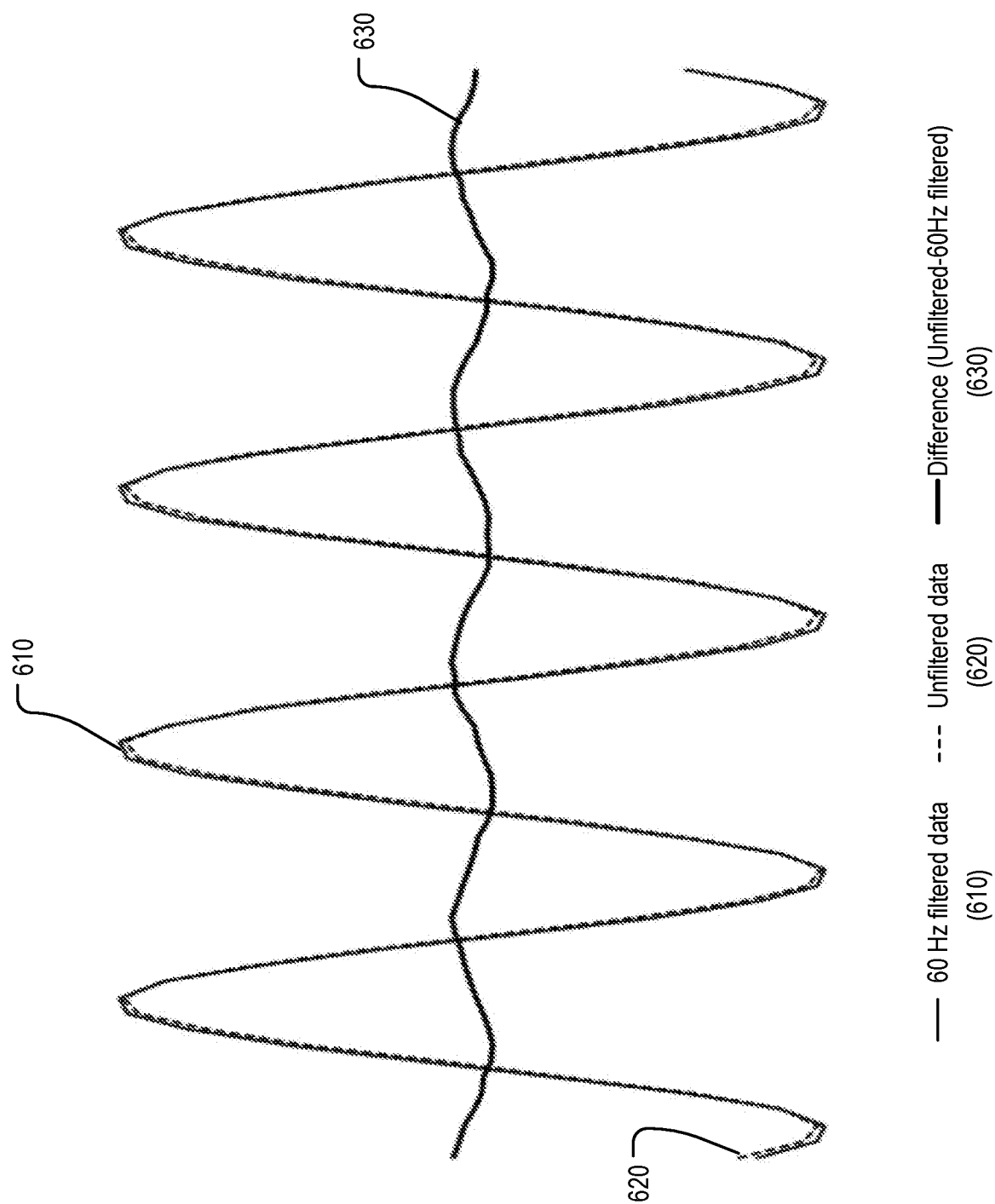
FIGS. 6A and 6B are examples of experimental data.
Figure 6B:
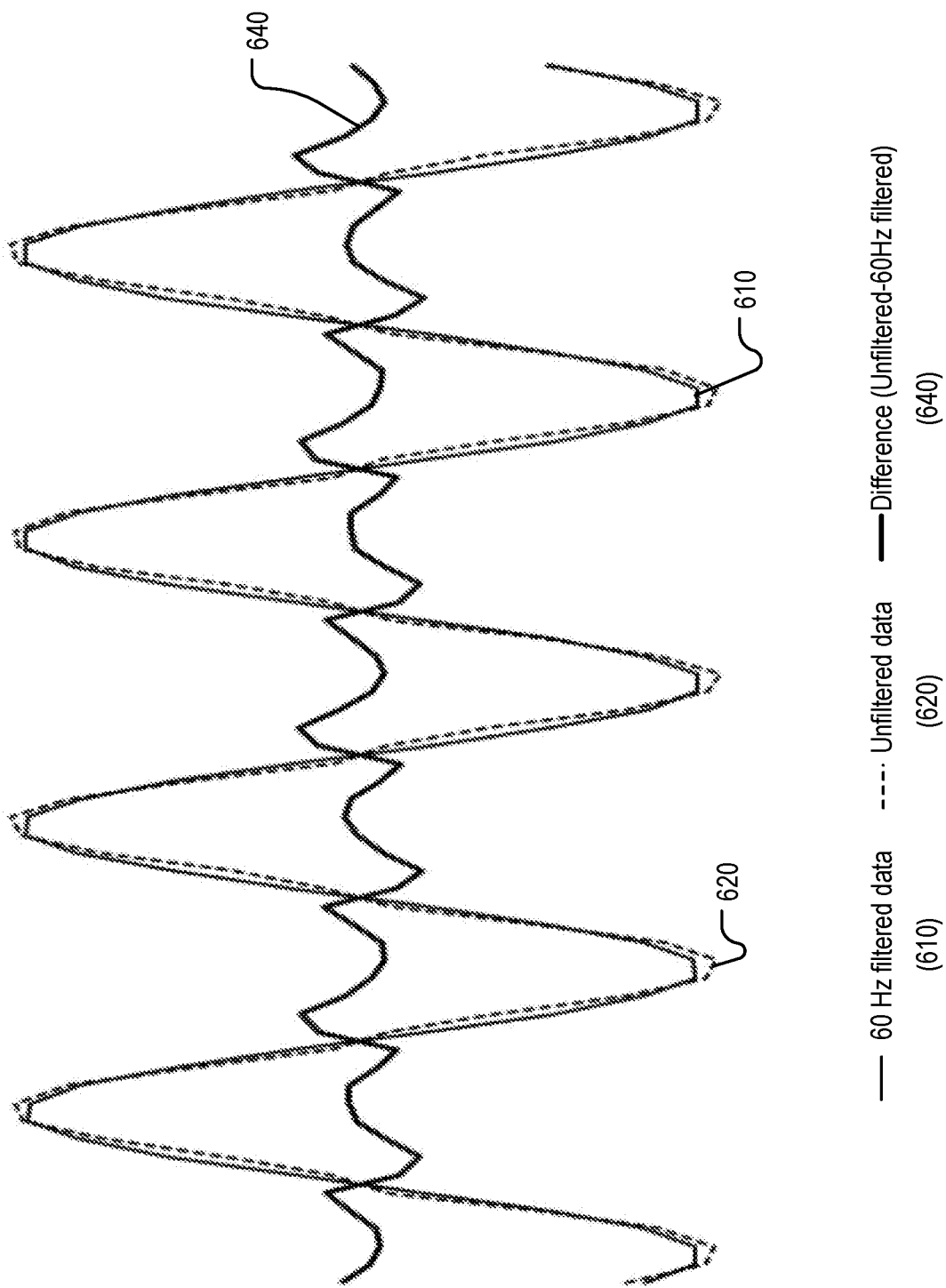

FIGS. 6A and 6B show example experimental data that include a comparison between a filtered current signal and an unfiltered current signal. FIG. 6A is a situation in which a downed conductor is not present, and there is a nominal load imbalance. FIG. 6B is a situation in which a 30 foot downed conductor on sandy gravel is present. The data 610 (plotted with the lighter of the two solid line styles on FIGS. 6A and 6B) represents the filtered current signal. In the example of FIGS. 6A and 6B, the power distribution network has a fundamental frequency of 60 Hz, and the filtered current signal includes only a 60 Hz component. In other words, the filtered current signal is approximately a sine wave with a frequency of 60 Hz. The data 620 (plotted with a dashed line on FIGS. 6A and 6B) represents the unfiltered current signal, which is the neutral current signal and may include frequencies other than the fundamental frequency.

The data 630 (plotted with the heavier of the two solid line styles in FIG. 6A) is the difference between the filtered current signal and the unfiltered current signal when no downed conductor is present, but other imbalances are present. The data 640 (plotted with the heavier of the two solid line styles FIG. 6B) is the difference between the filtered current signal and the unfiltered current signal when a downed conductor is present. The characteristics of the unfiltered current signal are more readily apparent from the difference data 630 and 640 than from the unfiltered current signal alone. Moreover, the characteristics of the data 640 (the data from the situation in which the downed conductor is present) are different from those of the data 630, indicating that the downed conductor produces a signature above and beyond that produced by other imbalances. The signature is detected and analyzed by the process 500 to detect the presence of the downed conductor.

Other implementations are within the scope of the claims.

What is claimed is:

1. A method of determining whether a downed conductor is present in an electrical power distribution network, the electrical power distribution network comprising a neutral line and a plurality of energized conductors, and the method comprising:
   receiving a sampled current signal, the sampled current signal comprising a plurality of values, each of the values representing an amplitude of current that flows in all of the plurality of energized conductors at a particular time and summed to produce a sampled neutral current signal;
   generating an unfiltered current signal based on the sampled current signal;
   filtering the sampled current signal to generate a filtered current signal;
   comparing the unfiltered current signal and the filtered current signal to generate an error signal; and
   analyzing the error signal to determine whether at least one of the plurality of conductors is a downed conductor.

2. The method of claim 1, further comprising filtering the error signal to generate a filtered error signal prior to analyzing the error signal.

3. The method of claim 2, wherein filtering the error signal to generate filtered error signal comprises filtering the error signal to generate a moving average of the error signal, and wherein analyzing the error signal to determine whether at least one of the plurality of conductors is a downed conductor comprises comparing the error signal to the generated moving average of the error signal.

4. The method of claim 3, wherein filtering the error signal comprises filtering the error signal with an infinite impulse response (IIR) filter.

5. The method of claim 1, wherein comparing the unfiltered current signal and the filtered current signal comprises determining a difference between the unfiltered current signal and the filtered current signal.

6. The method of claim 5, wherein determining the difference between the unfiltered current signal and the filtered current signal comprises determining a difference between each sample of the unfiltered signal and a corresponding sample of the filtered signal.

7. The method of claim 1, wherein a downed conductor determined to exist, and further comprising: generating a perceivable warning signal based on the determination that a down conductor exists.

8. The method of claim 1, wherein a downed conductor is determined to exist, and further comprising: disconnecting the downed conductor from the electrical power distribution network.

9. The method of claim 1, wherein the electrical power distribution network comprises an alternating current (AC) distribution network having a fundamental frequency, and filtering the sampled current signal comprises removing frequency components that are not at the fundamental frequency.

10. A system comprising:
    an electrical apparatus configured to measure current that flows in a plurality of conductors in an electrical power distribution network that comprises a neutral line; and
    a control coupled to the electrical apparatus, the control comprising a downed conductor detection module configured to:
    receive a sampled current signal, the sampled current signal comprising a plurality of values, each of the values representing an amplitude of current that flows in all of the plurality of conductors at a particular time and summed to produce a sampled neutral current signal;
    generate an unfiltered current signal based on the received sampled current signal;
    filter the received sampled current signal to generate a filtered current signal;
    compare the unfiltered current signal and the filtered current signal to generate an error signal; and
    analyze the error signal to determine whether at least one of the plurality of conductors is a downed conductor.

11. The system of claim 10, wherein the electrical apparatus comprises a recloser, and the control comprises a recloser control.

12. The system of claim 10, wherein the electrical apparatus comprises a circuit breaker, and the control comprises a protective relay.

13. The system of claim 10, wherein
    the electrical apparatus comprises:

current sensors that measure the current that flows in the plurality of conductors; and an interrupting module;

the downed conductor detection module comprises a current signal generator configured to:

receive an indication of the measured current from the current sensors; and generate the sampled current signal from the indication of the measured current, and wherein the sampled current signal is received from the current signal generator; and if at least one of the conductors is determined to be a downed conductor, the control system is further configured to: command the interrupting module to isolate each of the downed conductors.

14. The system of claim 10, wherein the electrical apparatus and the control are integrated and form an integrated device in a single housing.

15. The system of claim 10, further comprising a data connection, and wherein the electrical apparatus and the control are coupled by the data connection, and the electrical apparatus and the control are configured to be physically separated from each other during operational use.

16. A control system configured to couple to an electrical apparatus that measures current flowing in more than one conductor of an electrical power distribution network, the electrical power distribution network comprising the conductors and a neutral line and the control system comprising a downed conductor detection module configured to:

receive a sampled current signal, the sampled current signal comprising a plurality of values, each of the values representing an amplitude of current that flows in all of the conductors at a particular time and summed to produce a sampled neutral current signal;

generate an unfiltered current signal based on the received sampled current signal;

filter the received sampled current signal to generate a filtered current signal;

compare the unfiltered current signal and the filtered current signal to generate an error signal; and analyze the error signal to determine whether at least one of the conductors is a downed conductor.

17. The control system of claim 16, wherein the downed conductor detection module is further configured to filter the error signal to generate a filtered error signal, and the downed conductor detection module is configured to determine whether at least one of the conductors is a downed conductor based on the filtered error signal.

18. The control system of claim 17, wherein the downed conductor detection module is configured to filter the error signal with an infinite impulse response (IIR) filter.

19. The control system of claim 16, wherein the downed conductor detection module is configured to compare the unfiltered current signal and the filtered current signal by determining a difference between the unfiltered current signal and the filtered current signal.

20. The control system of claim 16, wherein if at least one of the conductors is determined to be a downed conductor, the downed conductor detection module is further configured to command an interrupting module to isolate each of the downed conductors.

* * * * *